(12) United States Patent
Sugiura et al.

(10) Patent No.: US 10,436,870 B2
(45) Date of Patent: Oct. 8, 2019

(54) MAGNETIC RESONANCE IMAGING APPARATUS

(71) Applicant: Toshiba Medical Systems Corporation, Otawara-shi (JP)

(72) Inventors: Takamasa Sugiura, Kawasaki (JP);
Kensuke Shinoda, Otawara (JP);
Takuya Fujimaki, Otawara (JP);
Yasunori Taguchi, Kawasaki (JP)

(73) Assignee: Canon Medical Systems Corporation, Otawara-shi (JP)

( * ) Notice: Subject to any disclaimer, the term of this patent is extended or adjusted under 35 U.S.C. 154(b) by 86 days.

(21) Appl. No.: 15/854,354

(22) Filed: Dec. 26, 2017

(65) Prior Publication Data
US 2018/0180695 A1 Jun. 28, 2018

(30) Foreign Application Priority Data
Dec. 28, 2016 (JP) .................................. 2016-256136

(51) Int. Cl.
*G01R 33/54* (2006.01)
*G01R 33/565* (2006.01)

(52) U.S. Cl.
CPC ..... *G01R 33/543* (2013.01); *G01R 33/56545* (2013.01)

(58) Field of Classification Search
CPC ............................ G01R 33/543; G01R 33/565
See application file for complete search history.

(56) References Cited

U.S. PATENT DOCUMENTS

| | | | | |
|---|---|---|---|---|
| 7,548,638 B2* | 6/2009 | Graessner | .............. | G01R 33/54 382/128 |
| 7,724,931 B2* | 5/2010 | Kuth | .................... | G06K 9/6206 382/128 |
| 2004/0167394 A1* | 8/2004 | Assmann | ......... | G01R 33/56316 600/419 |
| 2008/0071163 A1* | 3/2008 | Zhang | .................... | A61B 5/055 600/410 |
| 2010/0002921 A1* | 1/2010 | Fenchel | ................. | A61B 5/055 382/128 |
| 2011/0210734 A1* | 9/2011 | Darrow | .............. | A61B 5/04842 600/411 |
| 2013/0154646 A1 | 6/2013 | Nitta et al. | | |
| 2014/0371573 A1* | 12/2014 | Komoto | ............. | A61B 5/04842 600/411 |
| 2016/0238682 A1 | 8/2016 | Nitta et al. | | |

FOREIGN PATENT DOCUMENTS

JP 2010-253051 11/2010
JP 2013-102889 5/2013

* cited by examiner

*Primary Examiner* — G. M. A Hyder
(74) *Attorney, Agent, or Firm* — Oblon, McClelland, Maier & Neustadt, L.L.P.

(57) ABSTRACT

A magnetic resonance imaging apparatus according to an embodiment includes processing circuitry. By using image data of a subject acquired by performing a first imaging process, the processing circuitry is configured to detect a first region including at least a part of a first site, the first site and a second site having a symmetrical relationship with each other in the subject. The processing circuitry is configured to derive a second region including at least a part of the second site on the basis of the first region. The processing circuitry is configured to set a Radio Frequency (RF) pulse application region used for performing a second imaging process, on the basis of the second region.

11 Claims, 9 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2016-256136, filed on Dec. 28, 2016; the entire contents of which are incorporated herein by reference.

FIELD

Embodiments described herein relate generally to a magnetic resonance imaging apparatus.

BACKGROUND

Conventionally, during an imaging process using a magnetic resonance imaging apparatus, it is a common practice that, when taking a diagnosis-purpose image, an operator such as a medical technologist sets a region of interest, by using an image for localizing the region of interest (hereinafter, "localizer image") that is taken in advance. To manually set such a region of interest requires experienced skills of the operator, a technique is known by which, for example, a region including a targeted organ is detected from the localizer image, so that a region of interest is automatically set on the basis of the detected region.

DETAILED DESCRIPTION

A Magnetic Resonance Imaging (MRI) apparatus according to an embodiment includes processing circuitry. By using image data of a subject acquired by performing a first imaging process, the processing circuitry is configured to detect a first region including at least a part of a first site, the first site and a second site having a symmetrical relationship with each other in the subject. The processing circuitry is configured to derive a second region including at least a part of the second site on the basis of the first region. The processing circuitry is configured to set a Radio Frequency (RF) pulse application region used for performing a second imaging process, on the basis of the second region.

Exemplary embodiments of the magnetic resonance imaging apparatus will be explained below, with reference to the accompanying drawings.

First Embodiment

Figure 1:
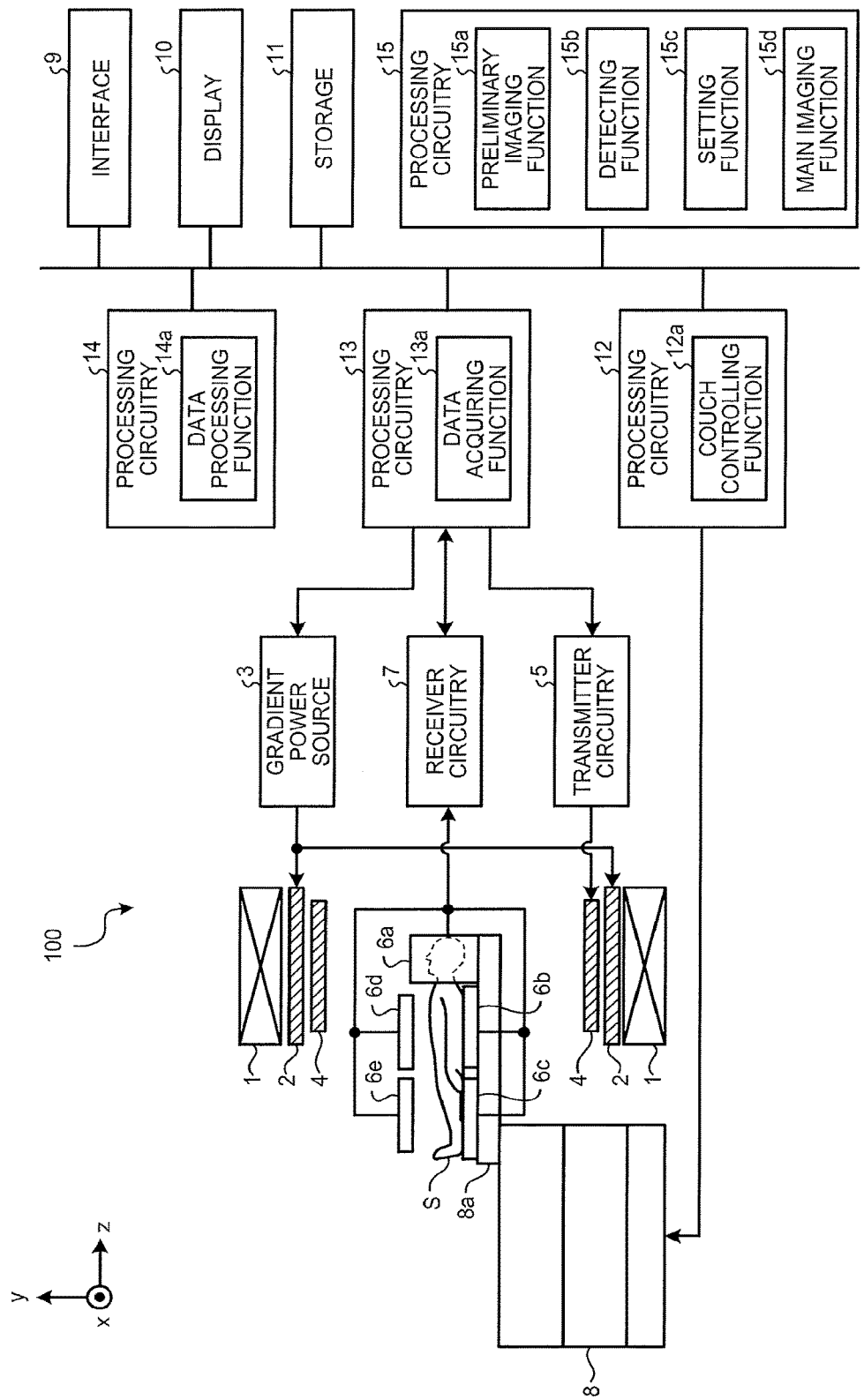
FIG. 1 is a diagram illustrating an exemplary configuration of a Magnetic Resonance Imaging (MRI) apparatus according to a first embodiment.

FIG. 1 is a diagram illustrating an exemplary configuration of an MRI apparatus according to a first embodiment. For example, as illustrated in FIG. 1, an MRI apparatus 100 includes a static magnetic field magnet 1, a gradient coil 2, a gradient power source 3, a transmitter coil 4, transmitter circuitry 5, receiver coils 6a to 6e, receiver circuitry 7, a couch 8, an interface 9, a display 10, a storage 11, and processing circuitries 12 to 15.

The static magnetic field magnet 1 is formed to have a hollow and substantially circular cylindrical shape (which may have an oval cross-section orthogonal to the central axis thereof) and is configured to generate a uniform static magnetic field in an imaging space formed in the space (the bore) on the inside thereof. For example, the static magnetic field magnet 1 includes a vacuum container formed to have a substantially circular cylindrical shape and a magnet such as a superconductive magnet or a normal conductive magnet that is immersed in cooling liquid (e.g., liquid helium) filling the vacuum container. The static magnetic field magnet 1 is configured to generate the static magnetic field in the space on the inside of the vacuum container.

The gradient coil 2 is formed to have a hollow and substantially circular cylindrical shape (which may have an oval cross-section orthogonal to the central axis thereof) and is disposed on the inside of the static magnetic field magnet 1. The gradient coil 2 includes three coils configured to generate gradient magnetic fields along x-, y-, and z-axes, respectively, that are orthogonal to one another. In this situation, the x-axis, the y-axis, and the z-axis structure an apparatus coordinate system unique to the MRI apparatus 100. For example, the x-axis direction is set in the horizontal direction, whereas the y-axis direction is set in the vertical direction. Further, the z-axis direction is set so as to be the same as the direction of a magnetic flux in the static magnetic field generated by the static magnetic field magnet 1.

By individually supplying an electric current to each of the three coils included in the gradient coil 2, the gradient power source 3 is configured to cause the gradient magnetic fields to be generated in the inside space, along the x-, y-, and z-axes, respectively. The gradient power source 3 is able to cause the gradient magnetic fields to be generated along a read-out direction, a phase-encoding direction, and a slice direction that are orthogonal to one another, by generating the gradient magnetic fields along the x-, y-, and z-axes, as appropriate. In this situation, the axes extending along the read-out direction, the phase-encoding direction, and the slice direction structure a logical coordinate system used for defining slice regions or a volume region serving as a target of an imaging process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

Further, the gradient magnetic fields are superimposed on the static magnetic field generated by the static magnetic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an imaging region is represented by slice regions, the slice gradient magnetic field is used for determining the orientations, the thicknesses, and the quantity of the slice regions. In contrast, when the imaging region is represented by a volume region, the slice gradient magnetic field appends position information along the slice direction to an MR signal, by varying the phase of the MR signal in accordance with the position in the slice direction.

The transmitter coil 4 is configured to apply a Radio Frequency (RF) pulse to the space on the inside thereof. More specifically, the transmitter coil 4 is formed to have a hollow and substantially circular cylindrical shape (which may have an oval cross-section orthogonal to the central axis thereof) and is disposed on the inside of the gradient coil 2. Further, on the basis of an RF pulse signal output from the transmitter circuitry 5, the transmitter coil 4 is configured to apply the RF pulse to the space on the inside thereof.

The transmitter circuitry 5 is configured to output the RF pulse signal corresponding to a Larmor frequency to the transmitter coil 4. For example, the transmitter circuitry 5 includes an oscillation circuit, a phase selecting circuit, a frequency converting circuit, an amplitude modulating circuit, and a radio frequency amplifying circuit. The oscillation circuit is configured to generate the RF pulse signal having a resonant frequency unique to a targeted atomic nucleus placed in the static magnetic field. The phase selecting circuit is configured to select a phase of the RF pulse signal output from the oscillation circuit. The frequency converting circuit is configured to convert the frequency of the RF pulse signal output from the phase selecting circuit. The amplitude modulating circuit is configured to modulate the amplitude of the RF pulse signal output from the frequency converting circuit, according to a sinc function, for example. The radio frequency amplifying circuit is configured to amplify the RF pulse signal output from the amplitude modulating circuit and to output the amplified RF pulse signal to the transmitter coil 4.

The receiver coils 6a to 6e are each configured to receive MR signals emitted from an imaging site of a subject S. For example, the receiver coils 6a to 6e are attached to the subject S placed on the inside of the transmitter coil 4 and are configured to receive the MR signals emitted from the imaging site of the subject S due to an influence of the RF pulses applied by the transmitter coil 4. Further, the receiver coils 6a to 6e are configured to output the received MR signals to the receiver circuitry 7. For example, each of the receiver coils 6a to 6e is an array coil including a plurality of element coils and is configured to output the MR signals received by the element coils to the receiver circuitry 7.

More specifically, the receiver coil 6a is a coil for the head and is attached to the head of the subject S. Further, the receiver coils 6b and 6c are coils for the spine and are disposed between the back of the subject S and a couchtop 8a. Further, the receiver coil 6d is a coil for the abdomen and is attached to the abdomen of the subject S. Further, the receiver coil 6e is a coil for a lower limb and is attached to a lower limb of the subject S.

The receiver circuitry 7 is configured to generate MR signal data on the basis of the MR signals output from the receiver coils 6a to 6e and to output the generated MR signal data to the processing circuitry 13. For example, the receiver circuitry 7 includes a selecting circuit, a pre-amplifying circuit, a phase detecting circuit, and an analog/digital converting circuit. The selecting circuit is configured to selectively receive an input of the MR signals output from the receiver coils 6a to 6e. The pre-amplifying circuit is configured to amplify the MR signals output from the selecting circuit. The phase detecting circuit is configured to detect the phases of the MR signals output from the pre-amplifying circuit. The analog/digital converting circuit is configured to generate the MR signal data by converting analog signals output from the phase detecting circuit into digital signals and to output the generated MR signal data to the processing circuitry 13.

In this situation, the receiver circuitry 7 includes a plurality of reception channels to receive the MR signals output from the plurality of elements coils included in the receiver coils 6a to 6e. Further, when being notified by the processing circuitry 15 as to which element coils are to be used for an imaging process, the receiver circuitry 7 assigns reception channels to the element coils indicated in the notification, to ensure that the MR signals output from the element coils indicated in the notification are received.

In the present example, the situation in which the transmitter coil 4 applies the RF pulse so that the receiver coils 6a to 6e receive the MR signals is explained; however, possible embodiments of the coils are not limited to this example. For instance, the transmitter coil 4 may further have a receiving function to receive the MR signals. Further, the receiver coils 6a to 6e may further have a transmitting function to apply an RF pulse. When the transmitter coil 4 has the receiving function, the receiver circuitry 7 generates MR signal data also from the MR signals received by the transmitter coil 4. Further, when the receiver coils 6a to 6e have the transmitting function, the transmitter circuitry 5 outputs an RF pulse signal also to the receiver coils 6a to 6e.

The couch 8 includes the couchtop 8a on which the subject S is placed. When an imaging process is performed on the subject S, the couchtop 8a is inserted into the imaging space formed on the inside of the static magnetic field magnet 1 and the gradient coil 2. For example, the couch 8 is installed in such a manner that the longitudinal direction thereof extends parallel to the central axis of the static magnetic field magnet 1.

The interface 9 is configured to receive operations to input various types of instructions and various types of information from the operator. More specifically, the interface 9 is connected to the processing circuitry 15 and is configured to convert the input operations received from the operator into electrical signals and to output the electrical signals to the processing circuitry 15. For example, the interface 9 is realized with a trackball, a switch button, a mouse, and a keyboard that are used for setting an imaging condition and a Region Of Interest (ROI), and the like; a touch pad used for performing an input operation by the user touching the operation surface thereof; a touch screen in which a display screen and a touch pad are integrally formed; a contactless input circuit using an optical sensor; an audio input circuit, and/or the like. In the present disclosure, the interface 9 is not limited to the configuration including physical operation component parts such as the mouse, the keyboard, and/or the like. For example, possible configurations of the interface 9 include an electrical signal processing circuit configured to receive electrical signals corresponding to input operations from an external input device provided separately from the apparatus and to output the received electrical signals to a controlling circuit.

The display 10 is configured to display various types of information and various types of image data. More specifically, the display 10 is connected to the processing circuitry 15 and is configured to convert the various types of information and the various types of image data sent thereto from the processing circuitry 15, into display-purpose electrical signals and to output the display-purpose electrical signals. For example, the display 10 is realized with a liquid crystal monitor, a Cathode Ray Tube (CRT) monitor, a touch panel, or the like.

The storage 11 is configured to store various types of data therein. For example, the storage 11 is configured to store therein the MR signal data and image data for each subject S. For example, the storage 11 is realized with a semiconductor memory device such as a Random Access Memory (RAM), a flash memory, or the like, or a hard disk, an optical disk, or the like. Alternatively, the storage 11 may be configured with a portable medium such as a Universal Serial Bus (USB) memory, a Digital Video Disk (DVD), or the like.

The processing circuitry 12 includes a couch controlling function 12a. The couch controlling function 12a is connected to the couch 8 and is configured to control operations of the couch 8 by outputting a control-purpose electrical signal to the couch 8. For example, the couch controlling function 12a receives, via the interface 9, an instruction to move the couchtop 8a in a longitudinal direction, an up-and-down direction, or a left-and-right direction from the operator and operates a driving mechanism for the couchtop 8a included in the couch 8 so as to move the couchtop 8a according to the received instruction.

The processing circuitry 13 includes a data acquiring function 13a. The data acquiring function 13a is configured to perform a data acquisition to acquire the MR signal data by driving the gradient power source 3, the transmitter circuitry 5, and the receiver circuitry 7, on the basis of sequence execution data output from the processing circuitry 15. In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of the RF pulse signal to be supplied from the transmitter circuitry 5 to the transmitter coil 4 and the timing with which the RF pulse signal is to be supplied; the timing with which the MR signals are to be detected by the receiver circuitry 7, and the like.

Further, the data acquiring function 13a is configured to receive the MR signal data from the receiver circuitry 7 as a result of executing various types of pulse sequences and to store the received MR signal data into the storage 11. A set made up of pieces of MR signal data received by the data acquiring function 13a is stored in the storage 11 as data structuring a k-space as a result of being arranged two-dimensionally or three-dimensionally according to the position information appended by the read-out gradient magnetic field, the phase-encoding gradient magnetic field, and the slice gradient magnetic field described above.

The processing circuitry 14 includes a data processing function 14a. The data processing function 14a is configured to generate image data on the basis of the MR signal data stored in the storage 11. More specifically, the data processing function 14a generates spectrum data or image data of a desired nuclear spin, by reading the MR signal data stored into the storage 11 by the data acquiring function 13a and further performing a reconstructing process such as a post-processing process (i.e., a Fourier transform or the like) on the read MR signal data. Further, when a localizer image is to be taken, the processing circuitry 14 generates, for each of the element coils, profile data indicating a distribution of MR signals in the array direction of the element coils, on the basis of the MR signals received by each of the plurality of element coils included in the receiver coils 6a to 6e. After that, the data processing function 14a stores the generated various types of data into the storage 11.

The processing circuitry 15 is configured to exercise overall control of the MRI apparatus 100 by controlling constituent elements of the MRI apparatus 100. For example, the processing circuitry 15 receives an imaging condition (e.g., an input of various types of parameters related to the pulse sequence) from the operator via the interface 9 and generates the sequence execution data on the basis of the received imaging condition. After that, the processing circuitry 15 controls the data acquisition to acquire the MR signal data, by transmitting the generated sequence execution data to the processing circuitry 13. Further, on the basis of the imaging condition, the processing circuitry 15 notifies the receiver circuitry 7 of the element coils to be used for the imaging process. Further, for example, the processing circuitry 15 reads image data requested by the operator from the storage 11 and outputs the read image data to the display 10.

A configuration of the MRI apparatus 100 according to the first embodiment has thus been explained. The MRI apparatus 100 according to the present embodiment configured as described above has a function of performing various types of imaging processes.

Generally speaking, during an imaging process using an MRI apparatus, when taking a diagnosis-purpose image, the operator such as a medical technologist sets a region of interest by using a localizer image. For example, during an MRI imaging process performed on a knee of a subject, the operator sets an imaging region including both the knee subject to the medical examination (hereinafter, "examined knee") and the other knee that is not subject to the medical examination (hereinafter, "non-target knee") as a region of interest, for the purpose of taking a sensitivity map. In another example, during an MRI imaging process performed on a knee of a subject, the operator sets a presaturation pulse application region as a region of interest on the non-target knee, for the purpose of preventing a diagnosis-purpose image of the examined knee from containing an unwanted aliasing image of the non-target knee.

Because manually setting such a region of interest requires experienced skills of the operator, it is also possible to use another method by which, for example, a region including the targeted organ is detected from the localizer image by performing a registration process with a model image or the like so that a region of interest is automatically set on the basis of the detected region.

However, when the localizer image does not enclose the targeted organ therein, the level of precision of the registration process may be low. For example, when a region of interest is set for an MRI process performed on a knee, as described above, although the region of the non-target knee is necessary, the region of the non-target knee may not necessarily be enclosed in the localizer image because the non-target knee is not subject to the medical examination. Further, even when the image of the non-target knee is enclosed, because the non-target knee to which no receiver coil is attached has smaller signal values (smaller luminance values), it may be impossible to detect the region of the non-target knee in a robust manner while using a commonly-used region detecting algorithm.

In view of these circumstances, the MRI apparatus 100 according to the present embodiment is configured to be able to set a region related to a site of the subject S in a robust manner.

More specifically, by using image data of the subject S acquired by performing a first imaging process, the MRI apparatus 100 according to the present embodiment is configured to detect a first region including at least a part of a first site, the first site and a second site having a symmetrical relationship with each other in the subject S. Further, on the basis of the first region, the MRI apparatus 100 is configured to derive a second region including at least a part of the second site. After that, on the basis of the detected second region, the MRI apparatus 100 is configured to set an RF pulse application region used for performing a second imaging process. In the following explanations, the RF pulse application region will serve as a region of interest.

To realize the configuration described above, the processing circuitry 15 in the present embodiment includes a preliminary imaging function 15a, a detecting function 15b, a setting function 15c, and a main imaging function 15d. In this situation, the processing circuitry 15 is an example of the processing circuitry set forth in the claims.

In the present embodiment, an example will be explained in which the first imaging process is a preliminary imaging process, whereas the second imaging process is the main imaging process. Further, in the present embodiment, an example will be explained in which the first site and the second site having a symmetrical relationship with each other in the subject are the knees in the lower limbs, while the first site is the knee subject to the medical examination (i.e., the examined knee), whereas the second site is the other knee that is not subject to the medical examination (i.e., the non-target knee). Further, in the present embodiment, an example will be explained in which volume data of the subject S is used as a localizer image.

The preliminary imaging function 15a is configured to generate the volume data that encloses therein the examined knee and includes at least a part of the non-target knee, by performing a preliminary imaging process (either a three-dimensional (3D) imaging process or a two-dimensional (2D) multi-slice imaging process) for a position determining purpose, prior to the main imaging process including a diagnosis-purpose imaging process. After that, the preliminary imaging function 15a is configured to store the generated volume data into the storage 11.

In this situation, for example, the preliminary imaging function 15a performs the imaging process on a Field Of View (FOV) of a predetermined size that encloses the examined knee therein and includes at least a part of the non-target knee, while using the center of the magnetic field of the MRI apparatus 100 as the center of the volume data. In this situation, the size of the FOV used in the preliminary imaging process may be constant at all times or may be determined for each apparatus. For example, the size of the FOV is determined on the basis of the bore diameter of the MRI apparatus 100 and the position and the size of the couch 8, in such a manner that, even when the center of the imaging process is fixed, the space where the subject S can be present is included with a certain percentage so as to always enclose the examined knee therein and to include at least a part of the non-target knee.

Further, for example, after having taken the volume data once, the preliminary imaging function 15a may be configured to receive an operation from the operator to set a region, within the volume data, that encloses the examined knee therein and includes at least a part of the non-target knee and to further take volume data of the set region. In other words, as long as the volume data eventually obtained encloses the examined knee therein and includes at least a part of the non-target knee, the procedure to obtain the volume data is not particularly limited.

The pulse sequence used in the preliminary imaging process may be the same as or different from the pulse sequence used in the diagnosis-purpose imaging process. However, in the preliminary imaging process, because it is desirable to obtain the volume data in as short a period of time as possible, it is desirable to use a pulse sequence for high-speed imaging. For example, for the preliminary imaging process, it is desirable to use a pulse sequence such as a Fast Field Echo (FFE) sequence, a Fast Spin Echo (FSE) sequence, a Steady-State Free Precession (SSFP) sequence, or the like. However, usable pulse sequences are not necessarily limited to these examples.

By using the volume data of the subject S taken by the preliminary imaging function 15a, the detecting function 15b is configured to detect a region including at least a part of the examined knee, from between the examined knee and the non-target knee.

More specifically, the detecting function 15b calculates a threshold value from the volume data by using a discriminant analysis method and determines pixels having signal values equal to or larger than the threshold value as foreground pixels. In this situation, the foreground pixels denote pixels other than the pixels considered to be noise and a background. Generally speaking, in volume data taken as a localizer image for a knee examination, the examined knee to which a receiver coil is attached is rendered with larger signal values than the background and the non-target knee are. For this reason, by performing the threshold value process, it is possible to easily extract the foreground pixels including the examined knee.

Figure 2:
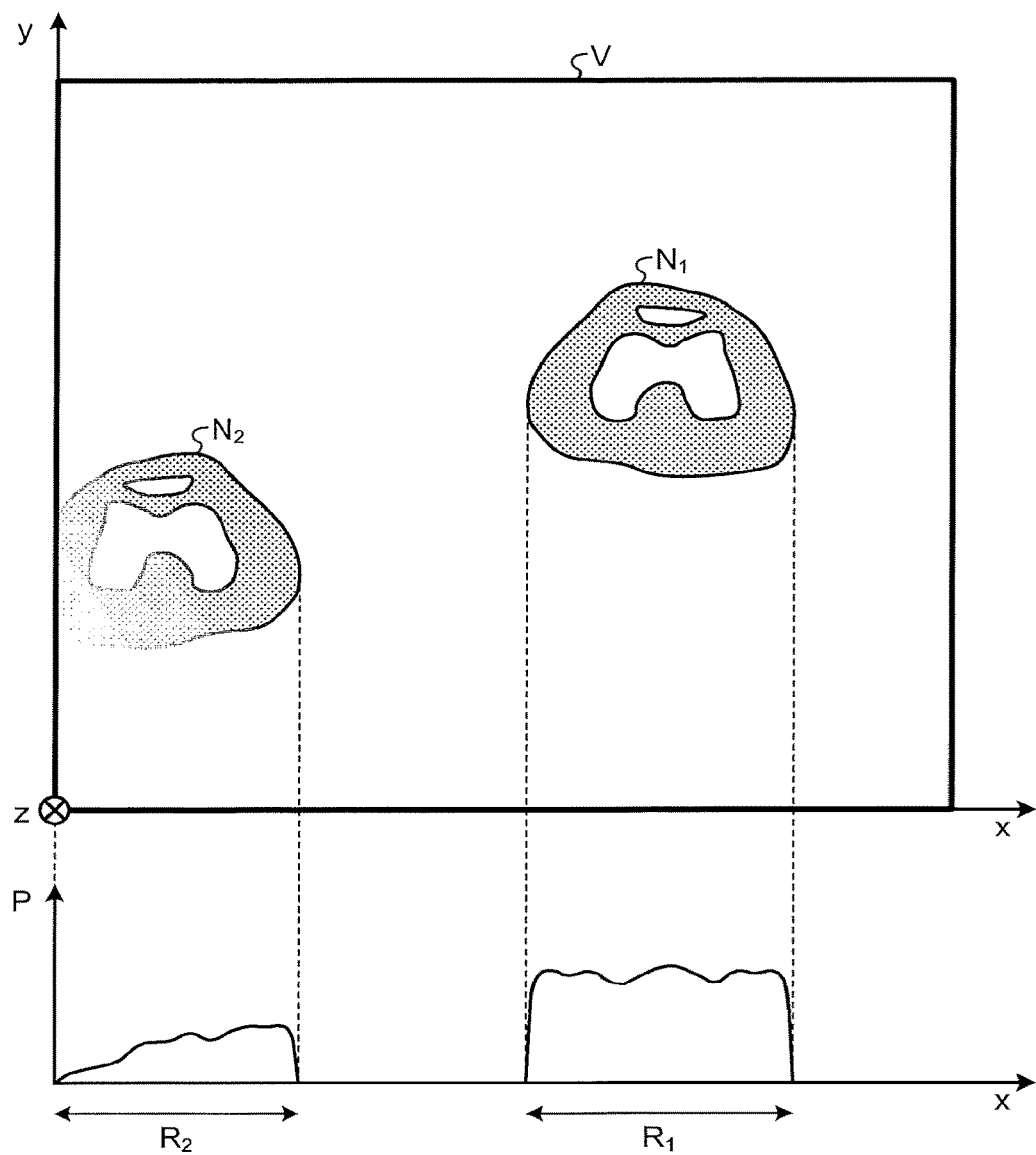
FIG. 2 is a drawing illustrating an example of a process performed by a detecting function according to the first embodiment to detect a region of a knee subject to a medical examination.

FIG. 2 is a drawing illustrating an example of a process performed by the detecting function 15b according to the first embodiment to detect a region of the examined knee. For example, as illustrated in FIG. 2, in volume data V, while using the left-and-right direction as an x-axis, the dorsal-ventral direction as a y-axis, and the head-and-feet direction as a z-axis, the detecting function 15b counts the quantity P of the foreground pixels that are present in the y-axis direction and in the z-axis direction at each of the x coordinates. After that, in the x-axis direction, while a span in which there are consecutive x coordinates at which the quantity P of foreground pixels is 1 or larger is determined as one region, the detecting function 15b calculates a total sum of the quantities P of foreground pixels for each of the regions and determines the foreground pixels at the x-coordinates of the region having the largest total sum as the region of the examined knee $N_1$.

For example, as illustrated in FIG. 2, when the volume data V includes the examined knee $N_1$ and the non-target knee $N_2$, the detecting function 15b detects a region $R_1$ corresponding to the examined knee $N_1$ and a region $R_2$ corresponding to the non-target knee $N_2$. In this situation, as explained above, in the volume data V, the examined knee $N_1$ is rendered with larger signal values than the non-target knee $N_2$ is. For this reason, by selecting the region in which the total sum of quantities P of the foreground pixels is the largest, it is possible to detect the region $R_1$ corresponding to the examined knee $N_1$.

In this manner, by selecting the largest region, it is possible to detect the region of the examined knee $N_1$ in a robust manner, without incorrectly detecting noise or the region of the non-target knee $N_2$ as the region of the examined knee $N_1$. Possible methods for detecting the region of the examined knee $N_1$ are not limited to the method described above. It is also acceptable to use other region detecting methods such as a k-means method or a mean shift method. Alternatively, for the purpose of eliminating the noise, it is acceptable, as appropriate, to apply a filtering process using a dilation filter, an erosion filter, a median filter, and/or the like, either in combination or alone, to the volume data or to a stage subsequent to the region detection result. Further, a machine learning method may be used by which signal values and the shape of the examined knee $N_1$, as well as a histogram of the volume data or the like are learned and detected.

On the basis of the region of the examined knee detected by the detecting function 15b, the setting function 15c is configured to derive a region including at least a part of the non-target knee and to set a region of interest (an RF pulse application region) used for performing the main imaging process, on the basis of the derived region.

More specifically, the setting function 15c detects at least one point on the outer circumference of the non-target knee from the volume data of the subject and further sets the region of interest on the basis of said at least one point and the region of the examined knee. In this situation, as said at least one point on the outer circumference of the non-target knee, the setting function 15c detects a point on the outer circumference that is positioned close to the receiver coil attached to the examined knee.

Further, by using the symmetrical relationships between the two knees, the setting function 15c derives the region of the non-target knee on the basis of the region of the examined knee and further sets the region of interest on the basis of the derived region. In this situation, on the basis of one or both of the size and the shape of the region of the examined knee, the setting function 15c derives the region of the non-target knee. Further, the setting function 15c derives the region of the non-target knee in such a manner that at least one selected from between the size in the left-and-right direction and the shape of the region of the non-target knee is substantially the same as that of the region of the examined knee.

In the present embodiment, an example will be explained in which the setting function 15c derives the region of the non-target knee on the basis of the size of the region of the examined knee. Further, in the present embodiment, an example will be explained in which, as regions of interest, the setting function 15c sets an imaging region of a sensitivity map taking process (hereinafter, "sensitivity map taking region") and a presaturation pulse application region.

Figure 3:
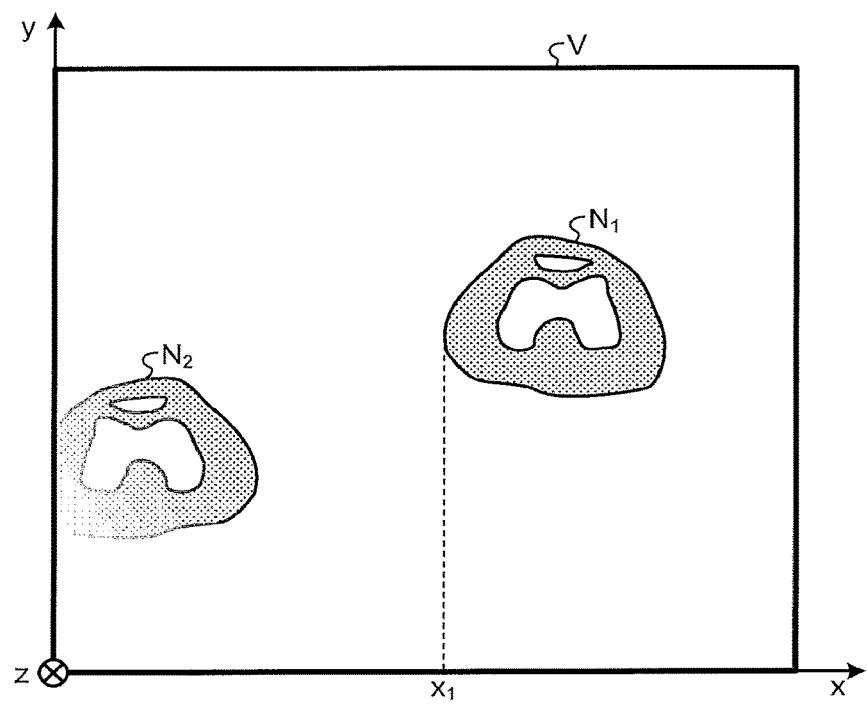
FIG. 3 is a drawing illustrating an example of a process performed by a setting function according to the first embodiment to detect a point on the outer circumference of a knee that is not subject to the medical examination.
Figure 4:
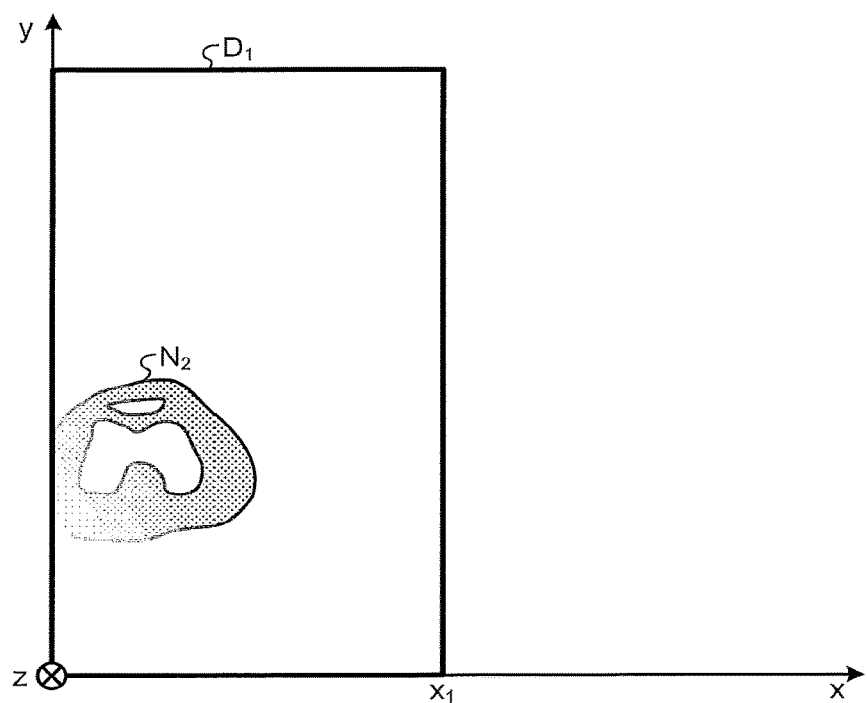
FIG. 4 is another drawing illustrating the example of the process performed by the setting function according to the first embodiment to detect the point on the outer circumference of the knee that is not subject to the medical examination.

FIGS. 3 to 8 are drawings illustrating an example of a process performed by the setting function 15c according to the first embodiment to detect a point on the outer circumference of the non-target knee. For example, as illustrated in FIGS. 3 and 4, at first, the setting function 15c generates exclusion data $D_1$ by eliminating, from the volume data V, the data from $x_1$ up to the end in the x-axis direction along the direction (the outward direction) including the region of the examined knee $N_1$, $x_1$ being the innermost x coordinate (on the side on which the non-target knee $N_2$ is positioned) of the region of the examined knee $N_1$.

Figure 5:
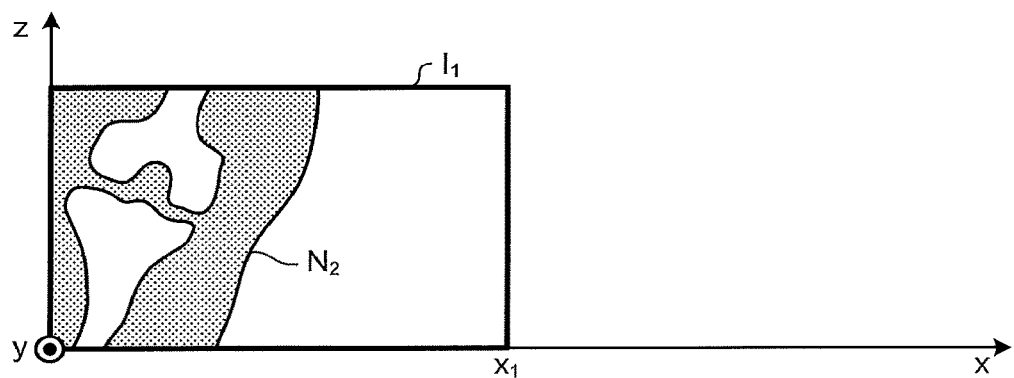
FIG. 5 is yet another drawing illustrating the example of the process performed by the setting function according to the first embodiment to detect the point on the outer circumference of the knee that is not subject to the medical examination.

After that, as illustrated in FIG. 5, for example, the setting function 15c generates a Maximum Intensity Projection (MIP) image $I_1$ projected in the dorsal-ventral direction (the y-axis direction) on the basis of the exclusion data $D_1$. Subsequently, the setting function 15c extracts foreground pixels including the non-target knee $N_2$, by performing a threshold value process and a largest region selecting process on the MIP image $I_1$, similarly to the detecting function 15b. Further, the setting function 15c counts the quantity of the foreground pixels at each of the z coordinates along the x-axis direction, starting with the upper side (the head side) of the MIP image $I_1$, so as to search for z coordinates at which the quantity of foreground pixels exceeds a predetermined value. The predetermined value used in this situation is a threshold value used for distinguishing noise from the non-target knee $N_2$ and may be 5, for example.

Figure 6:
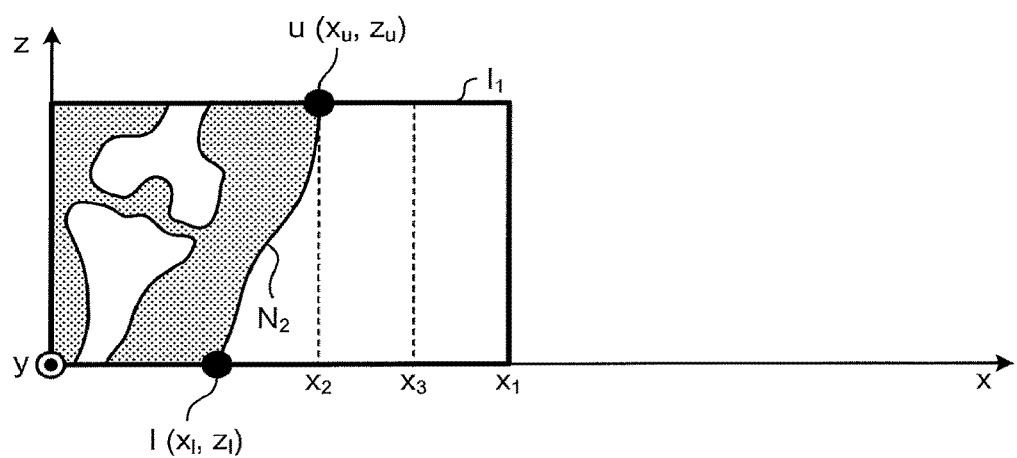
FIG. 6 is yet another drawing illustrating the example of the process performed by the setting function according to the first embodiment to detect the point on the outer circumference of the knee that is not subject to the medical examination.

After that, for example, as illustrated in FIG. 6, while searching from the upper side (the head side) of the MIP image $I_1$, the setting function 15c expresses the coordinates of the innermost foreground pixel (positioned on the side on which the examined knee $N_1$ is positioned) at the very first z coordinate where the quantity of foreground pixels exceeds the predetermined value, as $u=(x_u, z_u)$. Similarly, while searching from the lower side (the feet side) of the MIP image $I_1$, the setting function 15c expresses the coordinates of the innermost foreground pixel at the very first y coordinate where the quantity of foreground pixels exceeds the predetermined value, as $l=(x_l, z_l)$.

Figure 7:
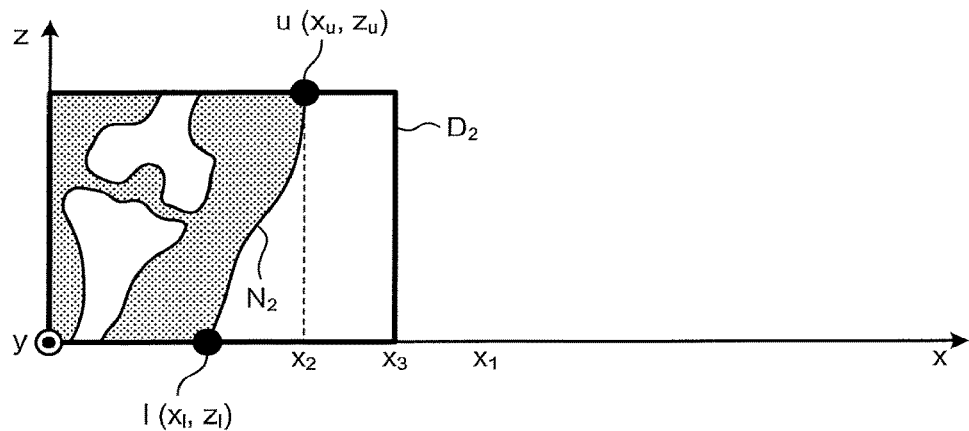
FIG. 7 is yet another drawing illustrating the example of the process performed by the setting function according to the first embodiment to detect the point on the outer circumference of the knee that is not subject to the medical examination.

After that, as illustrated in FIG. 7, for example, the setting function 15c expresses the x coordinate ($x_u$, in the example in FIG. 7) of one of the two points u and l that is positioned more inward than the other as $x_2$ and expresses the x coordinate of the middle point between $x_1$ and $x_2$ as $x_3$. After that, the setting function 15c generates exclusion data $D_2$ by eliminating, from the volume data V, the data from $x_3$ up to the end in the x-axis direction along the direction including the region of the examined knee $N_1$.

Figure 8:
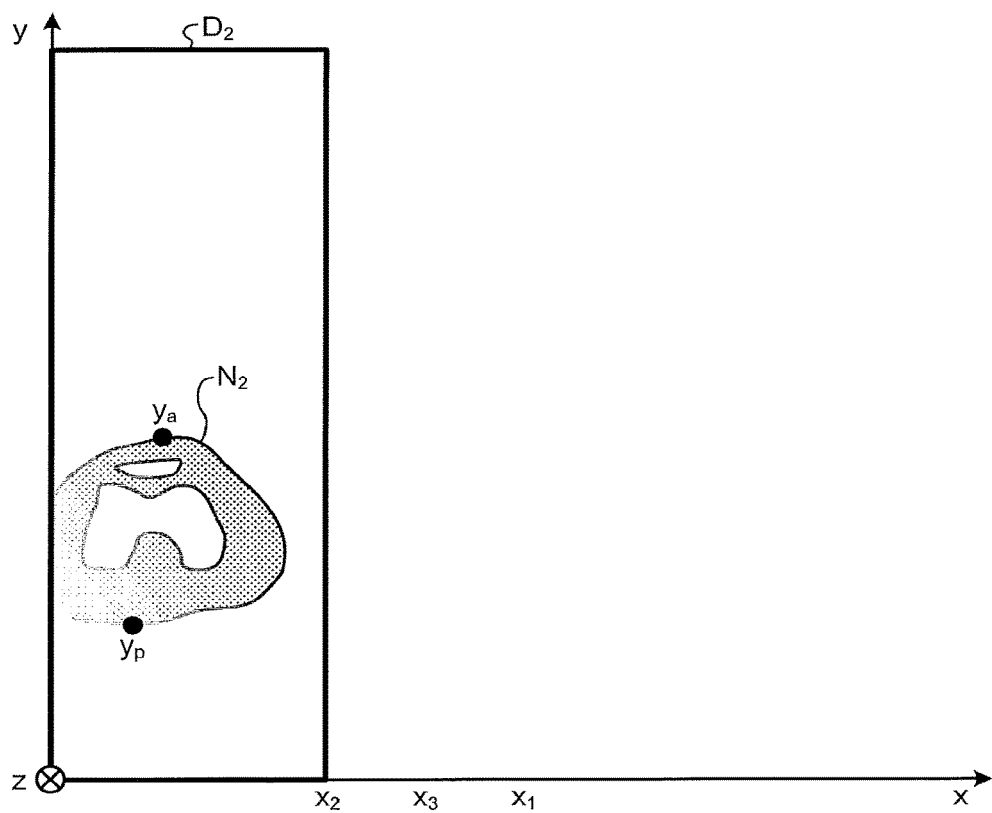
FIG. 8 is yet another drawing illustrating the example of the process performed by the setting function according to the first embodiment to detect the point on the outer circumference of the knee that is not subject to the medical examination.

Subsequently, as illustrated in FIG. 8, for example, by performing a threshold value process on the exclusion data $D_2$, the setting function 15c detects the pixel positioned closest to the ventral side and the pixel positioned closest to the dorsal side as points on the outer circumference of the non-target knee $N_2$. After that, for example, the setting function 15c expresses the y coordinate of the pixel positioned closest to the ventral side as $y_a$ and expresses the y coordinate of the pixel positioned closest to the dorsal side as $y_p$.

In this situation, for example, if a threshold value process were applied to the exclusion data $D_1$, because rough elements and noise therein would be detected as the foreground pixels, it would be difficult to detect the coordinates $y_a$ and $y_p$ in a robust manner. In contrast, because the exclusion data $D_2$ is obtained by eliminating the data starting from the x coordinate positioned farther away from the region of the examined knee $N_1$ compared to the exclusion data $D_1$, rough elements and noise in the surroundings of the examined knee $N_1$ are also eliminated in a sufficient manner. Accordingly, by performing the threshold value process on the exclusion data $D_2$ as explained above, it is possible to detect the coordinates $y_a$ and $y_p$ in a robust manner.

Possible methods for detecting the points on the outer circumference of the non-target knee $N_2$ are not limited to the example described above. For example, the setting function 15c may detect the points directly from the volume data by using a region detecting method such as a k-means method or a mean shift method, without generating the exclusion data or may detect the points by performing any of various types of filtering processes.

Further, on the basis of the region of the examined knee $N_1$ detected by the detecting function 15b as well as $y_a$ and $y_p$, the setting function 15c derives a region of the non-target knee $N_2$. More specifically, by using $y_a$ and $y_p$ as reference points, the setting function 15c derives a region of which the dimensions in the left-and-right direction and the dorsal-ventral direction are substantially the same as those of the region of the examined knee $N_1$, as the region of the non-target knee $N_2$.

Figure 9:
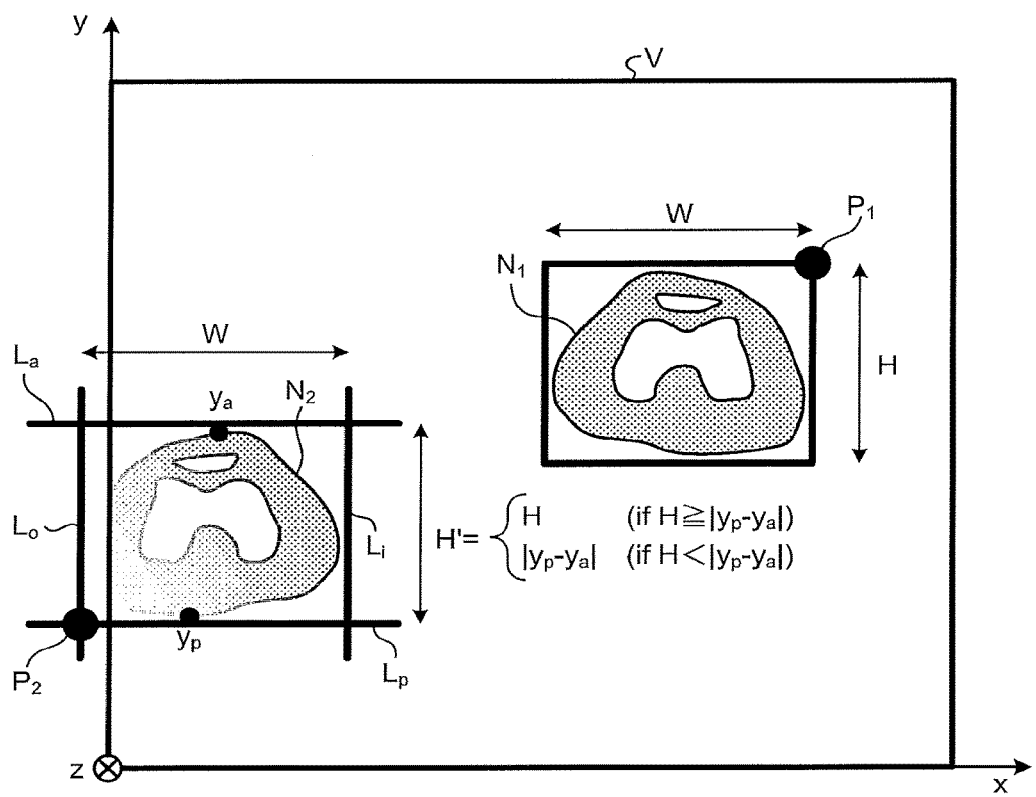
FIGS. 9 and 10 are drawings of an example of a process performed by the setting function according to the first embodiment to derive a region of a knee that is not subject to a medical examination.
Figure 10:
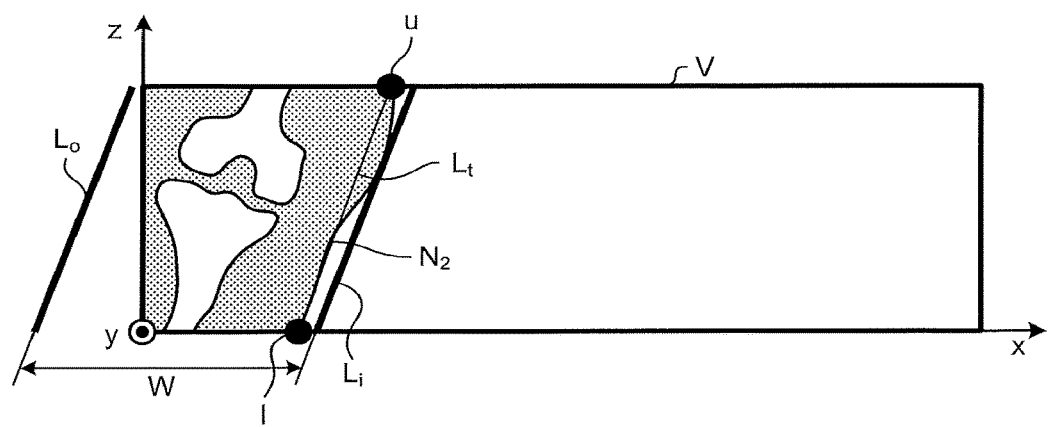

FIGS. 9 and 10 are drawings of an example of the process performed by the setting function 15c according to the first embodiment to derive the region of the non-target knee. For example, as illustrated in FIG. 9, the setting function $15_c$ expresses the dimension of the region of the examined knee $N_1$ in the left-and-right direction as W and the dimension thereof in the dorsal-ventral direction as H. In this situation, W and H may be the dimensions in the left-and-right and the dorsal-ventral directions of a bounding rectangle of the region of the examined knee $N_1$ that has the same axial directions as those of the volume data V (i.e., is parallel to the volume data V) or may be the dimensions in the left-and-right and the dorsal-ventral directions of a bounding rectangle oriented parallel to the region of the examined knee $N_1$. In normal MRI examinations on knees, because the examined knee is usually placed so as to be as parallel to the couch 8 as possible, the knee is also substantially parallel with respect to the volume data V. Accordingly, it is considered that there is no significant difference between using the former and the latter.

At first, with respect to the region of the non-target knee $N_2$, the setting function 15c derives the span thereof in the dorsal-ventral direction. More specifically, the setting function 15c compares H with $|y_a-y_p|$. When $H\geq|y_a-y_p|$ is satisfied, the setting function 15c calculates a straight line $L_p$ that passes through $y_a$ and is obtained from a parallel displacement of a straight line $L_a$ extending parallel to the x-axis of the volume data V, toward the dorsal direction by H. After that, the setting function 15c determines the span defined by $L_a$ and $L_p$ as the span of the region the non-target knee $N_2$ in the dorsal-ventral direction. On the contrary, when $H<|y_a-y_p|$ is satisfied, the setting function 15c calculates a straight line $L_p$ that passes through $y_p$ and extends parallel to the x-axis of the volume data V. After that, the setting function 15c determines the span defined by $L_a$ and $L_p$ as the span of the region the non-target knee $N_2$ in the dorsal-ventral direction.

In this situation, during normal MRI processes on knees, because the imaging process is usually performed while the examined knee is slightly bent, whereas the non-target knee is kept straight, the examined knee is positioned on the ventral side relative to the non-target knee. For this reason, the part of the non-target knee on the ventral side is positioned closer to the receiver coil attached to the examined knee and thus tends to have larger signal values than the part thereof on the dorsal side. As a result, between $y_a$ and $y_p$ described above, the point $y_a$ positioned closer to the dorsal side is detected in a more robust manner than the point $y_p$, as a point on the outer circumference of the non-target knee. To cope with this situation, the setting function 15c adopts the larger of H and $|y_a-y_p|$ and thus makes it possible to derive the region of the non-target knee $N_2$ having a size equal to or larger than that of the examined knee $N_1$, even when the level of precision for detecting $y_p$ is low.

Alternatively, instead of detecting both $y_a$ and $y_p$ as described above, the setting function 15c may be configured to detect only the point $y_a$ positioned closer to the receiver coil attached to the examined knee $N_1$. In that situation, similarly to the above situation where $H\geq|y_a-y_p|$ is satisfied, the setting function 15c calculates a straight line $L_p$ that passes through $y_a$ and is obtained from a parallel displacement of the line $L_a$ extending parallel to the x-axis of the volume data V toward the dorsal direction by H and further determines the span defined by $L_a$ and $L_p$ as the span of the region of the non-target knee $N_2$ in the dorsal-ventral direction.

Subsequently, with respect to the region of the non-target knee $N_2$, the setting function 15c derives the span thereof in the left-and-right direction. More specifically, for example, as illustrated in FIG. 10, the setting function 15c calculates a straight line $L_t$ connecting u and l together and further calculates a straight line $L_i$ that is in contact with the inner side of the non-target knee $N_2$ and is obtained from a parallel displacement of the line $L_t$ in the inward direction so as not to include the foreground pixels of the non-target knee $N_2$. Further, the setting function 15c calculates a straight line $L_o$ obtained from a parallel displacement of the line $L_i$ in the outward direction by W and determines the span defined by $L_i$ and $L_o$ as the span of the region of the non-target knee $N_2$ in the left-and-right direction.

As explained above, by utilizing the characteristic where there is no significant difference in size between the left knee and the right knee, the setting function 15c derives the region having the equal size to that of the examined knee $N_1$ as the region of the non-target knee $N_2$, while using, as the reference points, the points on the inner side and the ventral side positioned closer to the receiver coil attached to the examined knee $N_1$.

After having derived the region of the examined knee $N_1$ in this manner, the setting function 15c sets a sensitivity map taking region and a presaturation pulse application region, on the basis of the region of the examined knee $N_1$ and the region of the non-target knee $N_2$.

Figure 11:
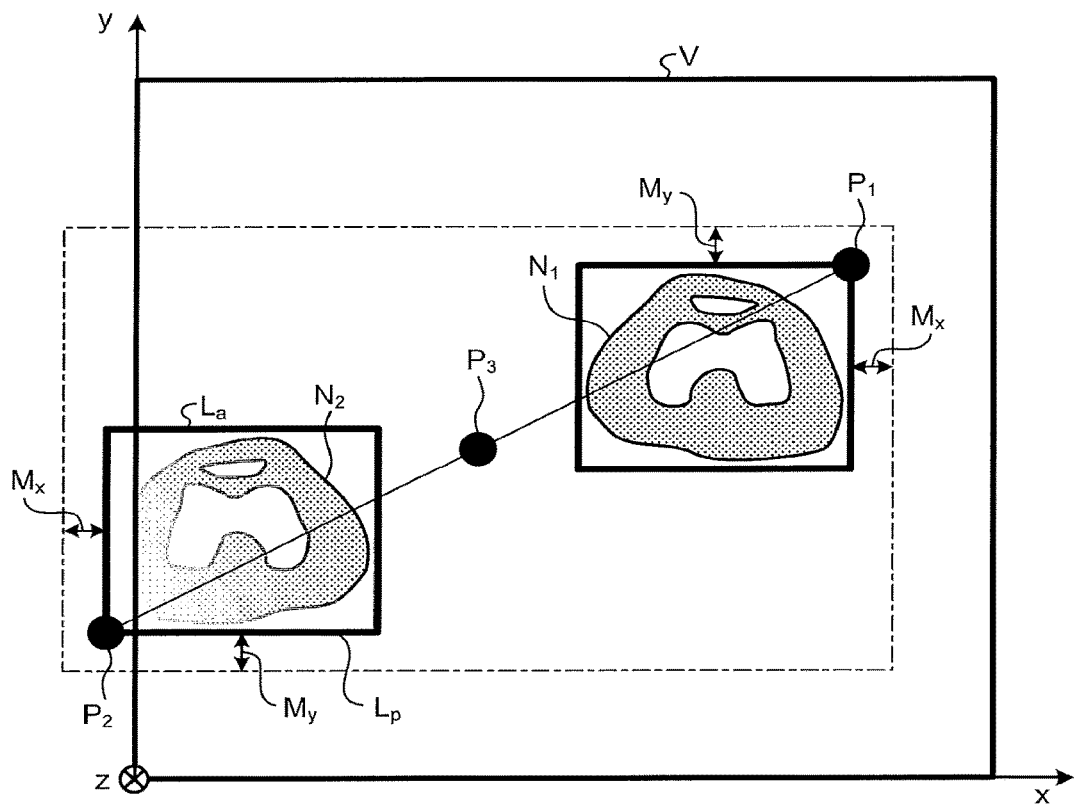
FIGS. 11 and 12 are drawings illustrating an example of a process performed by the setting function according to the first embodiment to set a region of interest.
Figure 12:
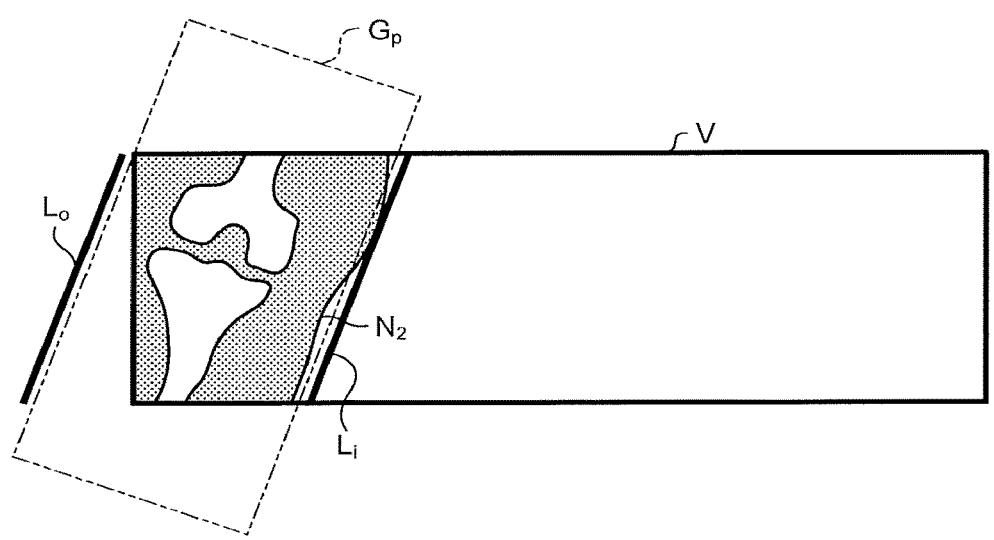

FIGS. 11 and 12 are drawings illustrating an example of a process performed by the setting function 15c according to the first embodiment to set a region of interest. For example, as illustrated in FIG. 11, the setting function 15$_c$ sets, as a sensitivity map taking region, an area (the area defined by the single-dashed line illustrated in FIG. 11) including both the region of the examined knee $N_1$ and the region of the non-target knee $N_2$.

For example, the setting function 15c identifies the x and y coordinates $(x_1, y_1)$ of a point $P_1$ positioned farthest from the region of the non-target knee $N_2$ from among the vertices of the bounding rectangle of the region of the examined knee $N_1$ and the x and y coordinates $(x_2, y_2)$ of a point $P_2$ positioned farthest from the examined knee $N_1$ from among the vertices of the bounding rectangle of the region of the non-target knee $N_2$. Further, the setting function 15c sets an area of which the center position is at the middle point $P_3$ $((x_1+x_2)/2, (y_1+y_2)/2)$ between the $P_1$ and $P_2$, as the sensitivity map taking region.

In this situation, as for the z coordinate of $P_3$, the setting function 15c calculates the center position of the knee by using, for example, a machine learning method, a registration method, or the like and uses the z coordinate of the center position as the z coordinate of $P_3$. Alternatively, when imaging regions of various types of diagnosis-purpose images have been determined, the setting function 15c may use an average z coordinate of the center positions of the imaging regions as the z coordinate of $P_3$. Alternatively, when the center of the knee is positioned relatively close to the center of the magnetic field, the setting function 15c may use the middle point of the z coordinates of the edges of the bounding rectangles of the two knees as the z coordinate of $P_3$ similarly to the x coordinate and the z coordinate or may use the center position of the volume data V as the z coordinate of $P_3$.

Further, as for the dimensions of the sensitivity map taking region, for example, the setting function 15c determines the dimension in the x-axis direction as $|x_2-x_1|+M_x$ and the dimension in the y-axis direction as $|y_2-y_1|+M_y$. In this situation, $M_x$ and $M_y$ each denote a margin in the corresponding axis direction and may be 0 or a prescribed value determined in advance. Further, as for the dimension of the sensitivity map taking region in the z-axis direction, for example, the setting function 15c sets a fixed value. Alternatively, when imaging regions of various types of diagnosis-purpose images have been determined, the setting function 15c may determine the dimension in the z-axis direction so as to include those imaging regions or may determine the dimension in the z-axis direction by adding a margin to the dimension of a bounding rectangle, in the same manner as for the x-axis and the y-axis directions.

Further, for example, as illustrated in FIG. 12, the setting function 15c sets an area (the area defined by the double-dashed line in FIG. 12) including the region of the non-target knee $N_2$ as a presaturation pulse application region.

For example, the setting function 15c sets the span of the region of the non-target knee $N_2$, i.e., a span that extends parallel to $L_o$ and $L_i$ and is defined by $L_o$ and $L_i$ as the span of the presaturation pulse application region in the left-and-right direction. Alternatively, the setting function 15c may set a span that extends parallel to $L_o$ and $L_i$ and is obtained by adding a margin to the span defined by $L_o$ and $L_i$, as the span of the presaturation pulse application region in the left-and-right direction. Alternatively, the setting function 15c may set a span that does not extend parallel to $L_o$ and $L_i$ but encloses the span defined by $L_o$ and $L_i$ in the direction orthogonal to the volume data V, as the span of the presaturation pulse application region in the left-and-right direction.

Further, for example, the setting function 15c sets the span of the region of the non-target knee $N_2$, i.e., the span defined by $L_a$ and $L_p$ as the span of the presaturation pulse application region in the dorsal-ventral direction. Alternatively, the setting function 15c may set a span obtained by adding a margin to the span defined by $L_a$ and $L_p$ as the span of the presaturation pulse application region in the dorsal-ventral direction. Alternatively, the setting function 15c may use an area of which the center position is at the middle point between $L_a$ and $L_p$ and which has a prescribed size determined in advance, as the span of the presaturation pulse application region in the dorsal/ventral direction.

Further, for example, the setting function 15c sets a span that is centered on the center position of the knee and has a prescribed size determined in advance, as the span of the presaturation pulse application region in the head-and-feet direction. Alternatively, when the imaging region of a diagnosis-purpose image that involves application of a presaturation pulse has been determined, the setting function 15c may set a span of which the center position is at the z coordinate of the position of the imaging region and which extends in the head-and-feet direction of the imaging region or a span obtained by adding a margin to the span, as the span of the presaturation pulse application region in the head-and-feet direction. Alternatively, when the imaging region of a diagnosis-purpose image that involves application of a presaturation pulse has been determined, the setting function 15c may apply a parallel displacement or adjust the size, so that the presaturation pulse application region does not overlap with the imaging region of the diagnosis-purpose image.

Further, as regions of interest, the setting function 15c sets an imaging region of a shimming imaging process (hereinafter, "shimming imaging region") and an imaging region of a diagnosis-purpose image. In this situation, as for the shimming imaging region, the setting function 15c may use an area set by the operator or may use the area of the region of the examined knee or an area obtained by adding a margin to the region of the examined knee. Further, as for the imaging region of the diagnosis-purpose image, the setting function 15c may use an area set by the operator or may automatically set an area by detecting feature points used as reference points during the setting process from the volume data through a machine learning process and calculating the imaging region on the basis of the feature points. For example, the setting function 15c may set an area that includes the region of the examined knee and does not include the region of the non-target knee as the imaging region for the diagnosis purpose.

As explained above, in the present embodiment, the setting function 15c sets the area including both the region of the examined knee and the region of the non-target knee, as the sensitivity map taking region. Further, the setting function 15c sets the area including the region of the non-target knee, as the presaturation pulse application region. Further, the setting function 15c sets either the area including the region of the examined knee or the area including the region of the non-target knee as the shimming imaging region. Further, the setting function 15c sets the area including the region of the examined knee and not including the region of the non-target knee, as the imaging region for the diagnosis purpose. In other words, in the present embodiment, on the basis of the region of the examined knee and the region of the non-target knee, the setting function 15c sets the region of interest (the RF pulse application region) so as to include one or both of the region of the examined knee and the region of the non-target knee.

By using the region of interest set by the setting function 15c as a Field Of View (FOV), the main imaging function 15d performs a main imaging process such as a sensitivity map taking process, a shimming imaging process, a diagnosis-purpose imaging process involving application of a presaturation pulse, while using any of various types of sequences.

In this situation, during the diagnosis-purpose imaging process, when performing an imaging process by setting the phase encoding direction as the left-and-right direction (e.g., taking an image on a coronal cross-section), the main imaging function 15d performs the imaging process by applying a presaturation pulse to the application region set by the setting function 15c. As a result, it is possible to take the diagnosis-purpose image without causing aliasing of the region of the non-target knee.

The pulse sequence used in the diagnosis-purpose imaging process may be, for example, a pulse sequence for a T2-weighted image, a T1-weighted image, a Fluid Attenuation Inversion Recovery (FLAIR) image, a diffusion image, a T2*-weighted image, or the like; however, the pulse sequence that can be used for the diagnosis-purpose imaging process is not limited to these examples. It is possible to determine a pulse sequence as appropriate in accordance with the imaging purpose of the main imaging process.

The processing functions of the processing circuitries 12 to 15 have thus been explained. The processing functions are, for example, stored in the storage 11, in the form of computer-executable programs. Each of the processing circuitries realizes the processing function corresponding to an appropriate one of the programs by reading the program from the storage 11 and executing the read program. In other words, the processing circuitries 12 to 15 that have read the programs have the processing functions illustrated in FIG. 1. Further, although FIG. 1 illustrates an example in which each of the processing functions included in the processing circuitries is realized by a single processing circuit, possible embodiments are not limited to this example. The processing functions of the processing circuitries may be realized as being distributed to or integrated together into one or more processing circuits. Further, although the example is explained above in which the single storage (the storage 11) stores therein the programs corresponding to the processing circuitries, another arrangement is also acceptable in which a plurality of storages are provided in a distributed manner, so that each of the processing circuitries reads a corresponding one of the programs from an individual storage.

In this situation, for example, each of the processing circuitries 12 to 15 is realized by using a processor. The term "processor" used in this situation denotes, for example, a circuit such as a Central Processing Unit (CPU), a Graphics Processing Unit (GPU), an Application Specific Integrated Circuit (ASIC), or a programmable logic device (e.g., a Simple Programmable Logic Device [SPLD], a Complex Programmable Logic Device [CPLD], or a Field Programmable Gate Array [FPGA]). Each of the processors realizes the function thereof by reading a program stored in the storage 11 and executing the read program. Alternatively, it is also acceptable to directly incorporate the program into the circuit of each of the processors, instead of having the programs stored in the storage 11. In that situation, each of the processors realizes the function thereof by reading the program incorporated in the circuit thereof and executing the read program. Further, the processors according to the present embodiment each do not necessarily have to be individually configured as a single circuit. It is also acceptable to structure a single processor by combining together a plurality of independent circuits so as to realize the functions thereof.

Figure 13:
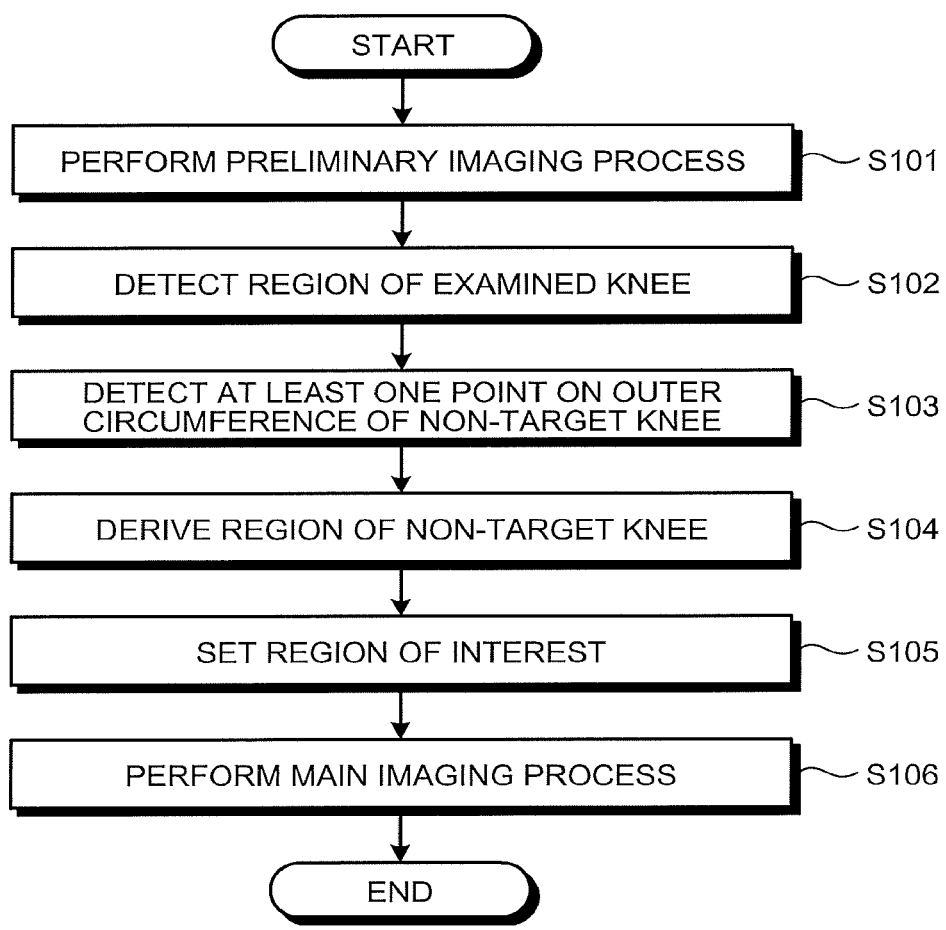
FIG. 13 is a flowchart illustrating a processing procedure in an imaging process performed by the MRI apparatus according to the first embodiment.

FIG. 13 is a flowchart illustrating a processing procedure in an imaging process performed by the MRI apparatus 100 according to the first embodiment. For example, as illustrated in FIG. 13, in the present embodiment, the preliminary imaging function 15a at first performs a preliminary imaging process for a position determining purpose (step S101).

After that, the detecting function 15b detects a region of the examined knee by using the volume data of the subject S taken by the preliminary imaging function 15a (step S102).

Subsequently, the setting function 15c detects at least one point on the outer circumference of the non-target knee, from the volume data of the subject (step S103). Further, by using the symmetrical relationship between the two knees, the setting function 15c derives a region of the non-target knee on the basis of the region of the examined knee (step S104). Further, the setting function 15c sets a region of interest on the basis of the derived region of the non-target knee (step S105).

After that, the main imaging function 15d performs a main imaging process, by using the region of interest set by the setting function 15c as a FOV (step S106).

In this situation, among the processing procedure illustrated in FIG. 13, the process at step S102 is realized as a result of, for example, the processing circuitry 15 invoking and executing a predetermined program corresponding to the detecting function 15b from the storage 11. Further, the processes at steps S103 through S105 are realized as a result of, for example, the processing circuitry 15 invoking and executing a predetermined program corresponding to the setting function 15c from the storage 11. Further, the process at step S106 is realized as a result of, for example, the processing circuitry 15 invoking and executing a predetermined program corresponding to the main imaging function 15d from the storage 11.

As explained above, the MRI apparatus 100 according to the first embodiment is configured to detect the region related to the non-target knee on the basis of the size of the region of the examined knee. Accordingly, even when the volume data includes only a part of the non-target knee or has small signal values, it is possible to detect the region related to the non-target knee in a robust manner. As a result, it is possible to set the sensitivity map taking area and the presaturation pulse application region that include the region of the non-target knee, in a robust manner. As a result, it is possible to improve the efficiency in setting the region of interest including the site that is not subject to the medical examination.

It is possible to carry out the first embodiment described above while applying a modification to a part thereof, as appropriate. In the following sections, modification examples of the first embodiment will be explained as other embodiments. In the following explanations, those embodiments will be explained while a focus is placed on differences from the first embodiment. Detailed explanations of some of the elements that are the same as those in the first embodiment or any other embodiment will be omitted.

Second Embodiment

For example, in the embodiment above, the example is explained in which the setting function 15c derives the region of the non-target knee, on the basis of the size of the region of the examined knee; however, possible embodiments are not limited to this example. For instance, the setting function 15c may derive the region of the non-target knee on the basis of the shape of the region of the examined knee.

In that situation, for example, the setting function 15c flips the left and the right of the shape of the region (e.g., the contour of the region) of the examined knee and further changes the shape thereof so as to be brought into correspondence with the non-target knee by applying an affine transformation to the left-right inverted shape. For example, the setting function 15c changes the left-right inverted shape so as to be brought into correspondence with such a pixel of the non-target knee that is positioned closest to the ventral side (the pixel of which the y coordinate is $y_a$) and such a point that has the same z coordinate as the pixel and is positioned closest to the ventral side. After that, the setting function 15c derives the region of the non-target knee, by calculating straight lines that are in contact with the shape brought into correspondence with the non-target knee, as the straight lines $L_a$, $L_p$, $L_o$, and $L_i$ explained in the first embodiment. In other words, in the second embodiment, the setting function 15c is able to derive the region of the non-target knee, without using the dimensions W and H of the examined knee explained in the first embodiment.

Further, the setting function 15c may derive the region of the non-target knee, by using both the size and the shape of the region of the examined knee. In that situation, for example, the setting function 15c flips the left and the right of the shape of the region of the examined knee and applies a parallel displacement to the left-right inverted shape while keeping the size thereof so as to be brought into correspondence with the non-target knee. After that, similarly to the above example, the setting function 15c derives the region of the non-target knee by calculating straight lines that are in contact with the shape brought into correspondence with the non-target knee.

Third Embodiment

Further, in the embodiment above, the example is explained in which the setting function 15c sets the region of interest on the basis of the region of the non-target knee, so that the main imaging function 15d performs the main imaging process by using the set region of interest as the FOV without applying any modification thereto. However, possible embodiments are not limited to this example. For instance, the setting function 15c may present detection results of the knees to the operator and receive corrections to be made on the detection results.

In that situation, for example, the setting function 15c causes the display 10 to display the region of the examined knee and the region of the non-target knee that are detected. Further, the setting function 15c receives, from the operator, an operation to change one or both of the size and the shape of the region of the examined knee and further changes the one or both of the size and the shape of the region of the non-target knee, in accordance with the received operation.

Figure 14:
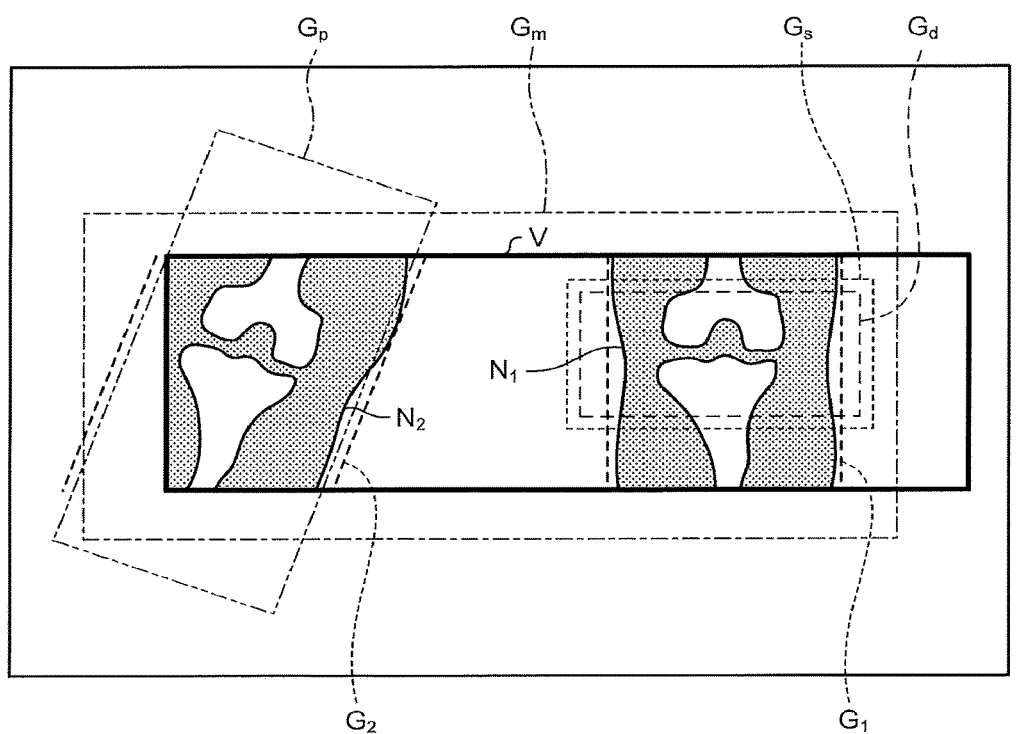
FIG. 14 is a drawing illustrating an example of a process performed by a setting function according to a third embodiment to receive an operation to change a region from an operator.

FIG. 14 is a drawing illustrating an example of a process performed by the setting function 15c according to a third embodiment to receive an operation to change a region, from the operator. For example, as illustrated in FIG. 14, the setting function 15c causes the display 10 to display the volume data V of the subject S, a graphic $G_1$ indicating the region of the examined knee $N_1$ and a graphic $G_2$ indicating the region of the non-target knee $N_2$. Further, the setting function 15c displays a graphic $G_m$ indicating a sensitivity map taking region, a graphic $G_p$ indicating a presaturation pulse application region, a graphic $G_s$ indicating a shimming imaging region, and a graphic $G_d$ indicating a diagnosis-purpose imaging region. After that, via the interface 9, the setting function 15c receives, from the operator, an operation to change the size and/or the shape of any of the graphics, and changes the size and/or the shape of the region corresponding to the designated graphic in accordance with the received operation.

In this situation, for example, when the size or the shape of the region of the examined knee $N_1$ has been changed, the setting function 15c re-derives a region of the non-target knee $N_2$, in accordance with the size or the shape after the change. Further, accordingly, the setting function 15c re-sets a sensitivity map taking region and a presaturation pulse application region, on the basis of the re-derived region of the non-target knee $N_2$. Further, when the shimming imaging region has been changed, because the shimming imaging region has an impact on the quality of images, the setting function 15c changes the region of the examined knee $N_1$ by the amount of the change. In addition, the setting function 15c accordingly changes the region of the non-target knee $N_2$ and further changes the sensitivity map taking region and the presaturation pulse application region.

Further, in that situation, for example, the setting function 15c is also capable of providing changing operations that utilize the fact that the region of the non-target knee $N_2$ is based on the size and the shape of the region of the examined knee $N_1$. In an example, the setting function 15c may impose restrictions as to what is changeable, by defining that, for instance, the position of the region of the non-target knee $N_2$ is changeable, but the size thereof is not changeable.

Although the example is explained above in which the setting function 15c displays both the region of the examined knee $N_1$ and the region of the non-target knee $N_2$, the setting function 15c does not necessarily have to display both. For example, because no diagnosis-purpose image is taken of the non-target knee $N_2$, it may not be necessary for the operator to check the image thereof. In that situation, the region of the non-target knee $N_2$ does not need to be displayed. Further, the sensitivity map taking region and the presaturation pulse application region do not necessarily have to be displayed either, when it is not necessary for the operator to check the images thereof.

Fourth Embodiment

In the embodiment described above, the example is explained in which the first site and the second site are the knees in the lower limbs. However, possible embodiments are not limited to this example. For instance, as long as the sites have a symmetrical relationship with each other in the body of the subject S, the same embodiment is applicable.

For example, as for the lower limbs, the same embodiment is applicable not only to imaging of the knees but also to imaging of the lower limbs in general such as imaging of the ankles, the thighs, the legs, or the like. Further, the same embodiment is also applicable not only to imaging of the lower limbs but also to imaging of the shoulders, when a sensitivity map taking region is set. Further, for example, when a subject is placed so that the heart is positioned at the center of the magnetic field, while a receiver coil is attached only to the left side of the subject, it is possible, by applying the same embodiment, to derive a region in an end part of the trunk on the right side having smaller signal values, on the basis of the size of a region of the trunk positioned on the left side of the spinal cord.

Fifth Embodiment

Further, in the embodiment described above, the example is explained in which the volume data is used as a localizer image; however, possible embodiments are not limited to this example. For instance, the same embodiment is applicable even when a two-dimensional region of interest is to be set, while using a two-dimensional image as a localizer image.

For example, when an axial cross-sectional image is used as a localizer image, the detecting function 15b counts the quantity P of the foreground pixels that are present in the y-axis direction at each of the x coordinates, while using the left-and-right direction as the x-axis and the dorsal-ventral direction as the y-axis. After that, in the x-axis direction, while a span in which there are consecutive x coordinates at which the quantity P of foreground pixels is 1 or larger is determined as one region, the detecting function 15b calculates a total sum of the quantities P of foreground pixels for each of the regions and determines the foreground pixels at the x-coordinates of the region having the largest total sum as the region of a first site. Further, the setting function 15c detects at least one point of a second site from the two-dimensional image and sets a region of interest related to the second site, on the basis of said at least one point and one or both of the size and the shape of the region of the first site.

According to at least one aspect of the embodiments described above, it is possible to set the regions related to the sites of the subject in a robust manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising processing circuitry configured:
   to detect, by using image data of a subject acquired by performing a first imaging process, a first region including at least a part of a first site, the first site having a symmetrical relationship with a second site in the subject;
   to derive a second region including at least a part of the second site on a basis of the first region; and
   to set a Radio Frequency (RF) pulse application region used for performing a second imaging process, on a basis of the second region.

2. The magnetic resonance imaging apparatus according to claim 1, wherein, in the image data, the first site is rendered with larger signal values than signal values with which the second site is rendered.

3. The magnetic resonance imaging apparatus according to claim 1, wherein the processing circuitry derives the second region on the basis of the first region by using the symmetrical relationship.

4. The magnetic resonance imaging apparatus according to claim 1, wherein the processing circuitry derives the second region on a basis of at least one of a size and a shape of the first region.

5. The magnetic resonance imaging apparatus according to claim 4, wherein the processing circuitry derives the second region in such a manner that at least one of a size in a left-and-right direction and a shape thereof is substantially same as that of the first region.

6. The magnetic resonance imaging apparatus according to claim 1, wherein the image data encloses the first site therein and includes at least a part of the second site.

7. The magnetic resonance imaging apparatus according to claim 1, wherein the processing circuitry detects at least one point on an outer circumference of the second site by using the image data and sets the RF pulse application region on a basis of said at least one point and the first region.

8. The magnetic resonance imaging apparatus according to claim 7, wherein, as said at least one point, the processing circuitry detects a point on the outer circumference that is positioned close to a receiver coil attached to the first site.

9. The magnetic resonance imaging apparatus according to claim 1, wherein the first site and the second site are lower limbs.

10. The magnetic resonance imaging apparatus according to claim 1, wherein the processing circuitry causes a display to display the first region and the second region, receives an operation from an operator to change at least one of a size and a shape of the first region, and changes at least one of a size and a shape of the second region in accordance with the operation.

11. The magnetic resonance imaging apparatus according to claim 1, wherein, on a basis of the first region and the second region, the processing circuitry sets an area including at least one of the first region and the second region, as the RF pulse application region.

* * * * *